(12) United States Patent
Tsutai et al.

(10) Patent No.: US 10,707,385 B2
(45) Date of Patent: Jul. 7, 2020

(54) WAVELENGTH CONVERSION MEMBER AND LIGHT-EMITTING DEVICE

(71) Applicant: NGK SPARK PLUG CO., LTD., Nagoya-shi, Aichi (JP)

(72) Inventors: Yoshifumi Tsutai, Tomiya (JP); Yumi Sato, Sendai (JP); Takashi Abe, Tomiya (JP); Yutaka Sato, Funabashi (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/066,086

(22) PCT Filed: Jan. 13, 2017

(86) PCT No.: PCT/JP2017/001075
§ 371 (c)(1),
(2) Date: Jun. 26, 2018

(87) PCT Pub. No.: WO2017/126440
PCT Pub. Date: Jul. 27, 2017

(65) Prior Publication Data
US 2019/0273190 A1 Sep. 5, 2019

(30) Foreign Application Priority Data
Jan. 22, 2016 (JP) .................... 2016-011098

(51) Int. Cl.
*H01L 33/50* (2010.01)
*F21K 9/64* (2016.01)
(Continued)

(52) U.S. Cl.
CPC ........... *H01L 33/504* (2013.01); *C09K 11/02* (2013.01); *C09K 11/08* (2013.01);
(Continued)

(58) Field of Classification Search
USPC ................................. 428/690, 917
See application file for complete search history.

(56) References Cited

U.S. PATENT DOCUMENTS

2005/0042743 A1    2/2005   Kawai et al.
2006/0255716 A1   11/2006   Tsutsumi et al.
(Continued)

FOREIGN PATENT DOCUMENTS

EP          2752897 A1    7/2014
JP     2006-319238 A   11/2006
(Continued)

OTHER PUBLICATIONS

Taiwan Intellectual Property Office, Office Action (Notification for the Opinion of Examination) issued in corresponding Application No. 106102005 dated Aug. 24, 2018.
(Continued)

*Primary Examiner* — Ashok Patel
(74) *Attorney, Agent, or Firm* — Stites & Harbison, PLLC; Jeffrey A. Haeberlin; James R. Hayne

(57) ABSTRACT

Provided are a fluorescent member that has high thermal conductivity, can prevent an increase in temperature of a fluorescent layer, and can maintain their fluorescence performance even during irradiation with high-intensity source light, and a light-emitting device using the fluorescent member. A transmissive-type wavelength conversion member 100 converts light with a wavelength in a specific range to light with a different wavelength and allows light passing through the wavelength conversion member to be used as illuminating light. The wavelength conversion member 100 includes: a substrate 110 that is formed of an inorganic material and allows light to pass through; and a fluorescent material layer 120 disposed on the substrate 110. The fluorescent material layer 120 includes fluorescent material particles 122 that absorb light and emit converted light and
(Continued)

a light-transmitting ceramic 121 that bonds the fluorescent material particles 122 together. The ratio of the thickness of the fluorescent material layer 120 to the average particle diameter of the fluorescent material particles 122 is less than 30.

4 Claims, 8 Drawing Sheets

(51) Int. Cl.

| | | |
|---|---|---|
| *F21V 9/30* | (2018.01) | |
| *C09K 11/02* | (2006.01) | |
| *C09K 11/08* | (2006.01) | |
| *C09K 11/77* | (2006.01) | |
| *G02B 5/20* | (2006.01) | |
| *H01L 33/60* | (2010.01) | |
| *F21V 29/70* | (2015.01) | |
| *F21V 29/502* | (2015.01) | |

(52) U.S. Cl.
CPC ............ *C09K 11/7706* (2013.01); *F21K 9/64* (2016.08); *F21V 9/30* (2018.02); *F21V 29/502* (2015.01); *F21V 29/70* (2015.01); *G02B 5/20* (2013.01); *H01L 33/50* (2013.01); *H01L 33/505* (2013.01); *H01L 33/60* (2013.01)

(56) References Cited

U.S. PATENT DOCUMENTS

| | | | | |
|---|---|---|---|---|
| 2013/0260139 | A1* | 10/2013 | Kamada | ............... C03C 17/007 428/328 |
| 2015/0004728 | A1* | 1/2015 | Taguchi | ............... H01L 33/505 438/29 |
| 2015/0171372 | A1* | 6/2015 | Iwata | ................... H01L 33/501 257/40 |
| 2015/0204494 | A1 | 7/2015 | Wada et al. | |
| 2017/0137706 | A1* | 5/2017 | Fujita | ...................... C09K 5/14 |
| 2018/0182932 | A1* | 6/2018 | Murazaki | ............. H01L 33/501 |

FOREIGN PATENT DOCUMENTS

| | | |
|---|---|---|
| JP | 2014-241431 A | 12/2014 |
| JP | 2015-038960 A | 2/2015 |
| JP | 2015-065425 A | 4/2015 |
| JP | 2015-090887 A | 5/2015 |
| JP | 2015-094777 A | 5/2015 |
| JP | 2015-119172 A | 6/2015 |
| JP | 2015-138839 A | 7/2015 |
| TW | 201517329 A | 5/2015 |
| WO | 2011-096074 A1 | 8/2011 |
| WO | 2015-178223 A1 | 11/2015 |

OTHER PUBLICATIONS

Japan Patent Office, International Search Report issued in International Stage Application No. PCT/JP2017/001075, dated Apr. 25, 2017.

Japan Patent Office, Written Opinion issued in International Stage Application No. PCT/JP2017/001075, dated Apr. 25, 2017.

European Patent Office, Extended European Search Report issued in corresponding Application No. 17741318.4 dated Aug. 21, 2019.

* cited by examiner

WAVELENGTH CONVERSION MEMBER AND LIGHT-EMITTING DEVICE

TECHNICAL FIELD

The present invention relates to a transmissive-type wavelength conversion member that converts light with a wavelength in a specific range to light with a different wavelength and allows light passing through the wavelength conversion member to be used as illuminating light and also relates to a light-emitting device.

BACKGROUND ART

In one known light-emitting element, a wavelength conversion member prepared by dispersing fluorescent material particles in a resin typified by epoxy, silicone, etc. is disposed so as to be in contact with, for example, a blue LED element. In recent years, there are an increasing number of applications that use, instead of LEDs, laser diodes (LDs) whose energy efficiency is high and which can easily adapt to a reduction in size and an increase in output power.

A laser irradiates a narrow area with high energy light. When a resin is locally irradiated with laser light, the irradiated portion is burnt. One solution proposed to address this issue is to irradiate a ring-shaped wavelength conversion member with laser light while the wavelength conversion member is rotated at high speed, in order to prevent burning (Patent Document 1).

However, with the above solution, apparatuses and devices are increased in size and complexity, and strong restrictions are imposed on the system. In other proposals, inorganic binders are used instead of the resin used to form the above wavelength conversion member, and wavelength conversion members composed only of inorganic materials are used (Patent Documents 2 to 7).

PRIOR ART DOCUMENTS

Patent Documents

Patent Document 1: Japanese Patent Application Laid-Open (kokai) No. 2015-94777
Patent Document 2: Japanese Patent Application Laid-Open (kokai) No. 2015-90887
Patent Document 3: Japanese Patent Application Laid-Open (kokai) No. 2015-38960
Patent Document 4: Japanese Patent Application Laid-Open (kokai) No. 2015-65425
Patent Document 5: Japanese Patent Application Laid-Open (kokai) No. 2014-241431
Patent Document 6: Japanese Patent Application Laid-Open (kokai) No. 2015-119172
Patent Document 7: Japanese Patent Application Laid-Open (kokai) No. 2015-138839

SUMMARY OF THE INVENTION

Problems to be Solved by the Invention

In the above wavelength conversion members using the inorganic binders, the heat resistance of the materials themselves is improved. However, fluorescent material particles generate heat due to laser power. As the heat is accumulated, the ability of the fluorescent material particles to emit light may disappear. Therefore, in practice, it is difficult to use these wavelength conversion members in a high-energy environment.

The present invention has been made in view of the above circumstances, and it is an object to provide a wavelength conversion member that has low thermal resistance, can prevent an increase in temperature of a fluorescent material layer, and can maintain their fluorescence performance even during irradiation with high-intensity source light, and a light-emitting device using the wavelength conversion member.

Means for Solving the Problems (1) In order to achieve the above-described object, the present invention provides a transmissive-type wavelength conversion member that converts light with a wavelength in a specific range to light with a different wavelength and allows light passing through the wavelength conversion member to be used as illuminating light. The wavelength conversion member is characterized by comprising a substrate that is formed of an inorganic material and allows light to pass therethrough; and a fluorescent material layer disposed on the substrate, the fluorescent material layer including fluorescent material particles that absorb light and emit converted light and a light-transmitting ceramic that bonds the fluorescent material particles together, wherein the ratio of the thickness of the fluorescent material layer to the average particle diameter of the fluorescent material particles is less than 30. Therefore, the wavelength conversion member has low thermal resistance, can prevent an increase in temperature of the fluorescent material layer, and can maintain the fluorescence performance even during irradiation with high-intensity source light.

Specifically, when source light having a wavelength in a specific range and a power density of 5 $W/mm^2$ is used, the intensity of fluorescence from the fluorescent material layer is at least 50% of a maximum fluorescence intensity of the fluorescent material layer. In this case, even when light is emitted at high power, the fluorescence performance does not deteriorate.

(2) Also, the wavelength conversion member of the present invention is characterized in that the wavelength conversion member satisfies the following conditions.

(a) When the average particle diameter of the fluorescent material particles is less than 1 µm, the ratio of the thickness of the fluorescent material layer to the average particle diameter of the fluorescent material particles is at least 2 and less than 30.

(b) When the average particle diameter of the fluorescent material particles is at least 1 µm and less than 5 µm, the ratio of the thickness of the fluorescent material layer to the average particle diameter of the fluorescent material particles is at least 2 and less than 15.

(c) When the average particle diameter of the fluorescent material particles is at least 5 µm and less than 10 µm, the ratio of the thickness of the fluorescent material layer to the average particle diameter of the fluorescent material particles is at least 2 and less than 10.

(d) When the average particle diameter of the fluorescent material particles is at least 10 µm, the ratio of the thickness of the fluorescent material layer to the average particle diameter of the fluorescent material particles is at least 1.5 and less than 5.

As described above, when the wavelength conversion member is used as a transmissive-type member, the proportion of the particles in the fluorescent material layer is not excessively high, and the thermal resistance at grain boundaries can be reduced. Moreover, the structure inside the fluorescent material layer can be made uniform, and uniform light can thereby be obtained. The uniform light in the present invention means that "a local spectral peak value of absorbed light (excitation light) measured using a 2D color analyzer (CA-2500, KONICA MINOLTA, INC.) is less than two times the average in-plane spectral peak value of the absorbed light (excitation light)."

(3) Also, the wavelength conversion member of the present invention is characterized in that the fluorescent material layer has a porosity of 30 to 70%, the porosity being defined as the ratio of the volume of pore portions in a constant-thickness layer section to the apparent volume of the constant-thickness layer section, the constant-thickness layer section being sandwiched between a plane in contact with the surface of an outermost one of the fluorescent material particles and a plane in contact with the substrate, the volume of the pore portions being computed by subtracting the volume of a solid component included in the apparent volume from the apparent volume. Since many pores are dispersed in the fluorescent material layer, the irradiation light is dispersed (irregularly reflected) in the fluorescent material layer, and this can facilitate irradiation of the fluorescent material particles with the light.

(4) Also, the wavelength conversion member of the present invention is characterized in that the substrate is made of sapphire. In this case, high thermal conductivity can be maintained, and an increase in the temperature of the fluorescent material layer can be suppressed.

(5) Also, a light-emitting device of the present is characterized by comprising a light source that generates source light having a wavelength in a specific range; and the wavelength conversion member described in any of the above-described paragraphs (1) to (4), the wavelength conversion member emitting light while absorbing the source light and converting the source light to light having a different wavelength. Therefore, the light-emitting device obtained can maintain its fluorescence performance even during irradiation with high-intensity source light.

Effects of the Invention

According to the present invention, low thermal resistance is achieved, and an increase in temperature of the fluorescent material layer can be prevented. Moreover, even during irradiation with high-intensity source light, the fluorescence performance can be maintained.

MODES FOR CARRYING OUT THE INVENTION

Figure 1:
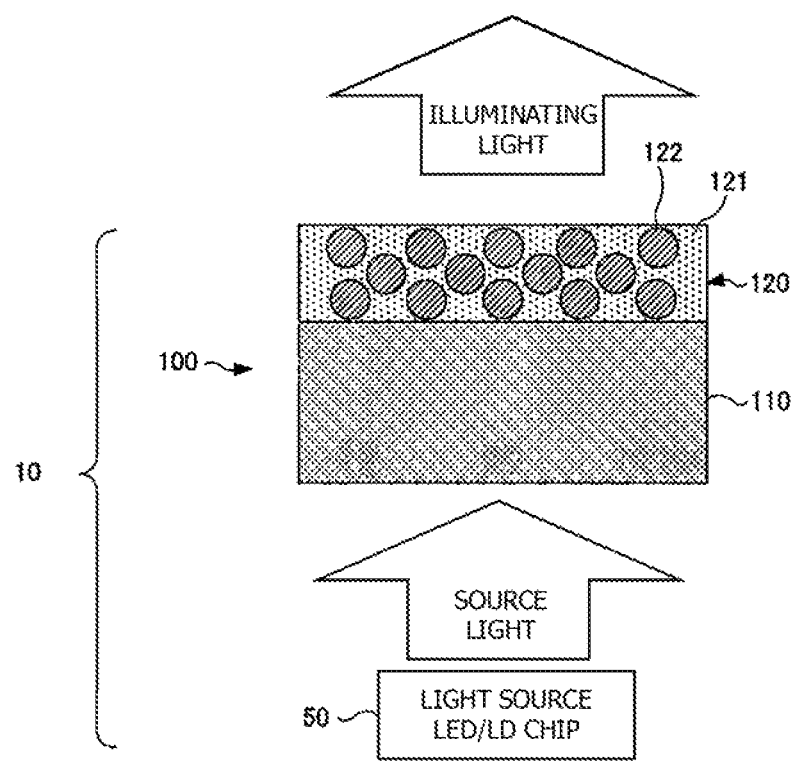
FIG. 1 is a schematic diagram showing the light-emitting device of the present invention.

Embodiments of the present invention will next be described with reference to the drawings. To facilitate the understanding of the description, the same components in the drawings will be denoted by the same reference numerals, and redundant description will be omitted. In each configuration diagram, the sizes of components shown are conceptual and do not indicate actual dimensional ratios.

[Structure of Transmissive-type Light-emitting Device]

FIG. 1 is a schematic diagram showing a transmissive-type light-emitting device 10. As shown in FIG. 1, the light-emitting device 10 includes a light source 50 and a wavelength conversion member 100 and emits illuminating light that is a combination of source light passing through the wavelength conversion member 100 and light generated through excitation by the source light within the wavelength conversion member 100. The illuminating light may be, for example, white light.

The light source 50 used may be an LED (Light Emitting Diode) chip or an LD (Laser Diode) chip. The LED generates source light having a wavelength in a specific range according to the design of the light-emitting device 10. For example, the LED generates blue light. When an LD is used, coherent light with small variations in wavelength and phase can be generated. The light source 50 is not limited to these chips and may generate light other than visible light. It is preferable that the light source 50 generates UV light, blue light, or green light, and it is particularly preferable that the light source 50 generates blue light.

[Structure of Transmissive-type Wavelength Conversion Member]

The wavelength conversion member 100 formed into a plate shape includes a substrate 110 and a fluorescent material layer 120. The wavelength conversion member 100 allows source light to pass through and is excited by the source light to thereby generate light having a different wavelength. For example, while blue light is allowed to pass through, yellow fluorescence or green fluorescence and red fluorescence are generated, whereby white light can be emitted. The substrate 110 is formed into a plate shape and may be made of, for example, an inorganic material capable of transmitting the source light such as glass or sapphire. Preferably, the substrate 110 is made of sapphire having high thermal conductivity. This can suppress heat accumulation in the fluorescent material layer 120 and suppress an increase in temperature, so that thermal quenching due to heat generation can be prevented.

The fluorescent material layer 120 is formed as a film on the substrate 110 and composed of fluorescent material particles 122 and a light-transmitting ceramic 121. The light-transmitting ceramic 121 bonds the fluorescent material particles 122 together and bonds the fluorescent material particles 122 to the substrate 110. Since the ratio of the thickness of the fluorescent material layer 120 to the diameter of the fluorescent material particles is small, the heat generated in the fluorescent material layer 120 can be efficiently transferred to the substrate 110, and an increase in temperature of the fluorescent material layer 120 can be prevented. As a result, the fluorescence performance is maintained even during irradiation with high-intensity source light.

Specifically, even when a high-energy density laser is used for the source light, thermal quenching due to heat generated by (heat accumulated in) the fluorescent material particles 122 can be prevented by forming the fluorescent material layer 120 as thin as possible provided that the required color design is achieved. In consideration of thermal conductivity, it is preferable that the thickness of the fluorescent material layer 120 is as shown in the following table.

The thermal resistance, which is the resistance to heat transfer, depends on the thickness of the fluorescent material layer when the thermal resistivity or thermal conductivity of the fluorescent material layer and its area are constant. The thermal resistance increases as the thickness increases. Under irradiation with laser light, the smaller the thermal resistance, i.e., the smaller the thickness, the easier the heat can be transferred, and the less heat is accumulated, so that thermal quenching due to heat generation (heat accumulation) can be prevented.

TABLE 1

| Average particle diameter (μm) | | Film thickness/ particle diameter | |
| --- | --- | --- | --- |
| At least | Less than | At least | Less than |
| — | 1 | 2 | 30 |
| 1 | 5 | 2 | 15 |
| 5 | 10 | 2 | 10 |
| 10 | — | 1.5 | 5 |

The light-transmitting ceramic 121 is an inorganic binder for holding the fluorescent material particles 122 and is composed of, for example, silica ($SiO_2$) or aluminum phosphate. For example, an yttrium-aluminum-garnet-based fluorescent material (YAG-based fluorescent material) or a lutetium-aluminum-garnet-based fluorescent material (LAG-based fluorescent material) may be used for the fluorescent material particles 122.

Alternatively, the material of the fluorescent material particles may be selected from the following materials according to the color design of the light to be emitted. Examples of the material of the fluorescent material particles include: blue fluorescent materials such as $BaMgAl_{10}O_{17}$:Eu, ZnS:Ag,Cl, $BaAl_2S_4$:Eu, and $CaMgSi_2O_6$:Eu; yellow and green fluorescent materials such as $Zn_2SiO_4$:Mn, (Y,Gd)$BO_3$:Tb, ZnS:Cu,Al, $(M1)_2SiO_4$:Eu, $(M1)(M2)_2S$:Eu, $(M3)_3Al_5O_{12}$:Ce, SiAlON:Eu, CaSiAlON:Eu, $(M1)Si_2O_2N$:Eu, and $(Ba,Sr,Mg)_2SiO_4$:Eu,Mn; yellow, orange, and red fluorescent materials such as $(M1)_3SiO_5$:Eu and (M1)S:Eu; and red fluorescent materials such as (Y,Gd)$BO_3$:Eu, $Y_2O_2S$:Eu, $(M1)_2Si_5N_8$:Eu, $(M1)AlSiN_3$:Eu, and $YPVO_4$:Eu. In the above chemical formulas, M1 includes at least one from the group consisting of Ba, Ca, Sr, and Mg, M2 includes at least one of Ga and Al, and M3 includes at least one from the group consisting of Y, Gd, Lu, and Te. The above fluorescent material particles are merely examples, and the fluorescent material particles used for the wavelength conversion member are not necessarily limited to the above particles.

Preferably, the porosity of the fluorescent material layer 120 is from 30% to 70% inclusive. Since many pores are formed in the fluorescent material layer 120, light is dispersed in the fluorescent material layer 120 even when it is thin, and the fluorescent material particles 122 are irradiated with the source light efficiently.

The thickness of the fluorescent material layer 120 depends on the average particle diameter of the fluorescent material particles 122, and it is preferable that the ratio of the thickness of the fluorescent material layer to the average particle diameter of the fluorescent material particles is within a prescribed range. Since the film thickness is less than a predetermined factor times the particle diameter of the fluorescent material particles, the number density of the particles in the fluorescent material layer 120 is not excessively high, and the thermal resistance at grain boundaries can be reduced. Therefore, a light-emitting device 10 whose fluorescence performance does not deteriorate even when light is emitted at high power can be formed. Such a light-emitting device 10 is expected to be highly effective when used for lighting of factories and public facilities such as stadiums and museums, head lamps of automobiles, etc. In addition, since the film thickness is equal to or greater than a predetermined factor times the particle diameter of the fluorescent material particles, the structure inside the fluorescent material layer 120 can be made uniform. In this case, the strength of the fluorescent material layer 120 can be maintained, and uniform light can be obtained.

In the above structure, when the power density of the source light for the wavelength conversion member 100 is 5 $W/mm^2$, it is preferable that the intensity of fluorescence from the fluorescent material layer 120 is at least 50% of the maximum fluorescence intensity of the fluorescent material layer 120. In the wavelength conversion member 100 having these characteristics, the transmittance of the film is within an appropriate range, and the fluorescence conversion performance of the fluorescent material layer 120 can be sufficiently utilized.

[Method for Producing Wavelength Conversion Member]

Figure 2:
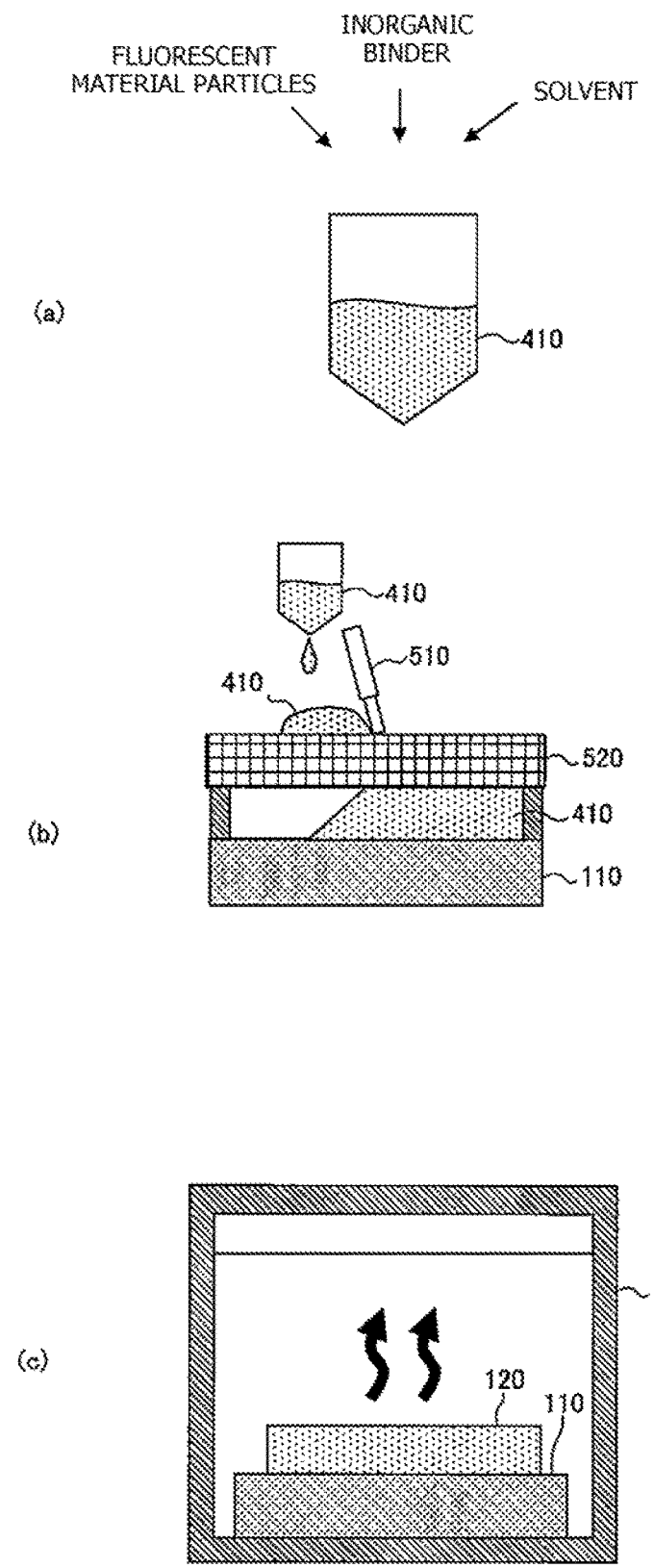
FIGS. 2(a), 2(b), and 2(c) are cross-sectional views showing the steps of producing the wavelength conversion member of the present invention.

FIGS. 2(a), 2(b), and 2(c) are cross-sectional views showing the steps of producing the wavelength conversion member of the present invention. First, an inorganic binder, a solvent, and the fluorescent material particles are prepared. As a preferred inorganic binder, for example, ethyl silicate obtained by dissolving a silicon precursor in ethanol may be used.

The inorganic binder may be obtained by reacting a raw material at room temperature or subjecting the raw material to heat treatment at a temperature of 500° C. or lower. The raw material contains at least one from the group consisting of silicon oxide precursors that form silicon oxide through hydrolysis or oxidation, silicate compounds, silica, and amorphous silica. Examples of the silicon oxide precursor include precursors composed mainly of perhydropolysilazane, precursors composed mainly of ethyl silicate, and precursors composed mainly of methyl silicate.

The solvent used may be a high-boiling point solvent such as butanol, isophorone, terpineol, or glycerin. The fluorescent material particles used may be, for example, YAG particles, LAG particles, etc. The type and amount of the fluorescent material particles are adjusted according to the illuminating light obtained from the source light. For example, to obtain white light from blue light, an appropriate amount of particles of a fluorescent material that emits yellow light under excitation by the blue light or particles of fluorescent materials that emit red light and green light under excitation is selected.

As shown in FIG. 2(a), the inorganic binder, the solvent, and the fluorescent material particles are mixed to prepare a paste (ink) 410. A ball mill, for example, may be used for mixing. Separately, a substrate made of an inorganic material is prepared. Glass, sapphire, etc. may be used for the substrate. Preferably, the substrate has a plate shape. When aluminum is used for the substrate, a reflective-type wavelength conversion member can be produced.

Next, as shown in FIG. 2(b), the paste 410 obtained is applied to the substrate 110 using a screen printing method such that the ratio of the thickness of the film of the paste 410 to the average particle diameter is within one of the ranges shown in the table above. The screen printing can be performed by pressing the paste 410 against a silk screen 520 stretched over a frame using an ink squeegee 510. Printing methods other than the screen printing method such as a spray method, a drawing method using a dispenser, and an inkjet method may be used. However, to form a thin fluorescent material layer stably, the screen printing method is preferred.

Then the paste 410 printed is dried and subjected to heat treatment in a furnace 600. The solvent and organic components in the inorganic binder are thereby evaporated, and a principal metal in the inorganic binder is oxidized (when the principal metal is Si, $SiO_2$ is formed). At that time, the fluorescent material layer 120 is bonded to the substrate 110. In this manner, a wavelength conversion member can be obtained.

A light-emitting device can be produced by bonding a wavelength conversion member prepared using a transmissive ceramic substrate to an LED chip or disposing the wavelength conversion member at a position spaced apart by a certain distance in a main light emission direction of the LED chip.

Figure 3:
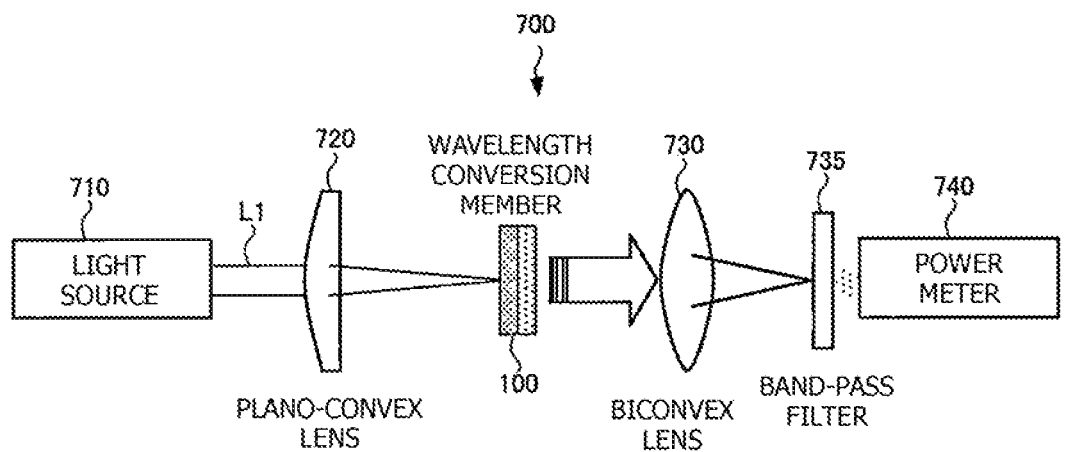
FIGS. 3(a) and 3(b) are cross-sectional views showing transmissive-type and reflective-type evaluation systems, respectively, for the wavelength conversion member.
Figure 3:
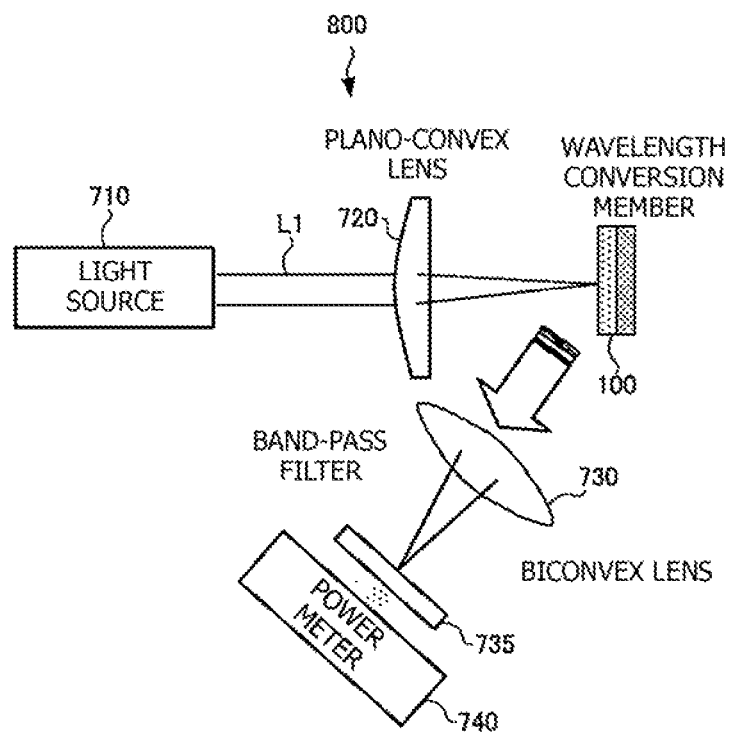

EXAMPLES (1. Examination of Quenched State for Each Substrate)
(1-1) Method for Producing Samples
First, wavelength conversion members were produced as follows. A paste prepared by mixing ethyl silicate, terpineol, and YAG fluorescent material particles (average particle diameter: 18 μm) was applied to glass, sapphire, and aluminum plates used as substrates to a thickness of 40 μm using a screen printing method, and the resulting substrates were subjected to heat treatment to thereby obtain wavelength conversion member samples.
(1-2) Evaluation Methods
Each of the wavelength conversion members obtained by the above production method was irradiated with laser light, and the emission intensity of fluorescence and the percent retention of light emission efficiency were examined while the laser input value was changed. FIGS. 3(a) and 3(b) are cross-sectional views showing transmissive-type and reflective-type evaluation systems 700 and 800, respectively, for the wavelength conversion members. As shown in FIG. 3(a), the transmissive-type evaluation system 700 includes a light source 710, a plano-convex lens 720, a biconvex lens 730, a band-pass filter 735, and a power meter 740. The band-pass filter 735 is a filter that blocks light with wavelengths of 480 nm or shorter and is disposed between the biconvex lens and the power meter to separate the fluorescence from the transmitted source light (excitation light) when the emission intensity of the fluorescence is measured.

The source light entering the plano-convex lens 720 is focused onto a focal point on the wavelength conversion member 100. Then light emitted from the wavelength conversion member 100 is condensed through the biconvex lens 730. Then components of the condensed light that have wavelengths of 480 nm or shorter are filtered out, and the intensity of the resulting light is measured by the power meter 740. The value measured is used as the emission intensity of the fluorescence. As shown in FIG. 3(b), the components of the reflective-type evaluation system 800 are the same as those of the-type evaluation system 700 but are arranged such that the light reflected from the wavelength conversion member 100 can be condensed and measured. By condensing laser light through a lens to reduce the area irradiated, the energy density per unit area can be increased even when a low-power laser is used. This energy density is used as laser power density.

Figure 4:
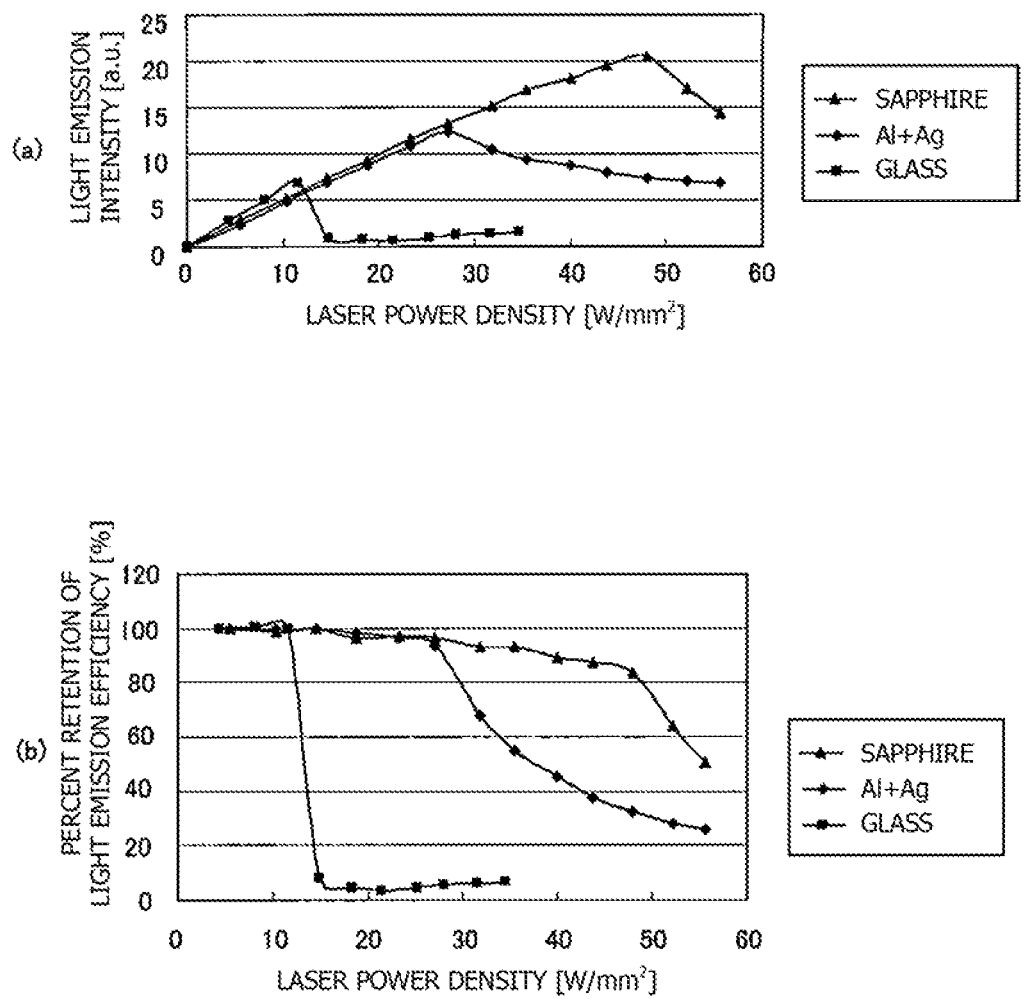
FIGS. 4(a) and 4(b) are graphs showing light-emission characteristics for different substrates.

The above two evaluation systems 700 and 800 were appropriately used to evaluate each of the wavelength conversion members. In the transmissive-type evaluation system 700, the samples including glass and sapphire substrates were used. In the reflective-type evaluation system 800, the sample including an aluminum substrate was used. The emission intensity of fluorescence is a relative intensity obtained by nondimensionalizing figures shown in a luminance meter in the evaluation system used. The percent retention of light emission efficiency is the ratio of the emission efficiency at a certain laser power density when the light emission efficiency at a low laser power density at which the influences of heat generation and heat accumulation can be neglected is set to 100%.
(1-3) Evaluation results
The evaluation results show the light-emission characteristics for each of the above substrates. FIGS. 4(a) and 4(b) are graphs showing the light-emission characteristics for different substrates. As can be seen, for each of the three substrates, as the power density increases, the emission intensity of fluorescence increases approximately linearly until a certain laser power density. For the sapphire substrate, the light emission starts decreasing at a laser power density of 48 $W/mm^2$. For the aluminum substrate, the light emission starts decreasing at a laser power density of 27 $W/mm^2$. For the glass substrate, the light emission starts decreasing at a laser power density of 11 $W/mm^2$. This shows that, among the three substrates, the sapphire substrate in particular can suppress quenching in the fluorescent material.

As temperature increases, the light-emission performance of fluorescent material particles decreases because of thermal quenching. The thermal conductivity of sapphire is higher than that of the glass. Therefore, in the sapphire substrate, the heat generated by the fluorescent material particles is less likely to be accumulated in the wavelength conversion member, and this may be the reason that the quenching in the fluorescent material is suppressed.

As can be seen from the above results, the quenching is more suppressed when the sapphire substrate is used than when the aluminum substrate having higher thermal conductivity is used. This may be because of the following reason. In the measurement when the transmissive sapphire substrate was used, since the laser light entered through the substrate, the heat accumulated in the fluorescent material was immediately dissipated to the substrate.
(2. Examination of Thermal Quenched State at Different Ratios of Thickness of Fluorescent Material Layer/Average Particle Diameter for the Case of Sapphire Substrate)
(2-1) Method for Producing Samples
A paste prepared by mixing ethyl silicate, terpineol, and YAG-based fluorescent material particles (average particle diameter: 6 μm) was applied to sapphire plates used as substrates to thicknesses of 9, 14, 30, 60, and 70 μm using a screen printing method to thereby obtain wavelength conversion member samples, as shown in the following table.

TABLE 2

| Film thickness/<br>particle diameter<br>[—] | Average particle<br>diameter [μm] | Film thickness<br>[μm] |
|---|---|---|
| 1.5 | 6 | 9 |
| 2 |  | 14 |
| 5 |  | 30 |
| 10 |  | 60 |
| 12 |  | 70 |

(2-2) Evaluation Method

Each of the wavelength conversion members obtained by the above-described wavelength conversion member production method was irradiated with laser light using the transmissive-type evaluation system 700, and the emission intensity of fluorescence and the percent retention of light emission efficiency were examined, while the laser power density was changed.

(2-3) Evaluation Results

Figure 5:
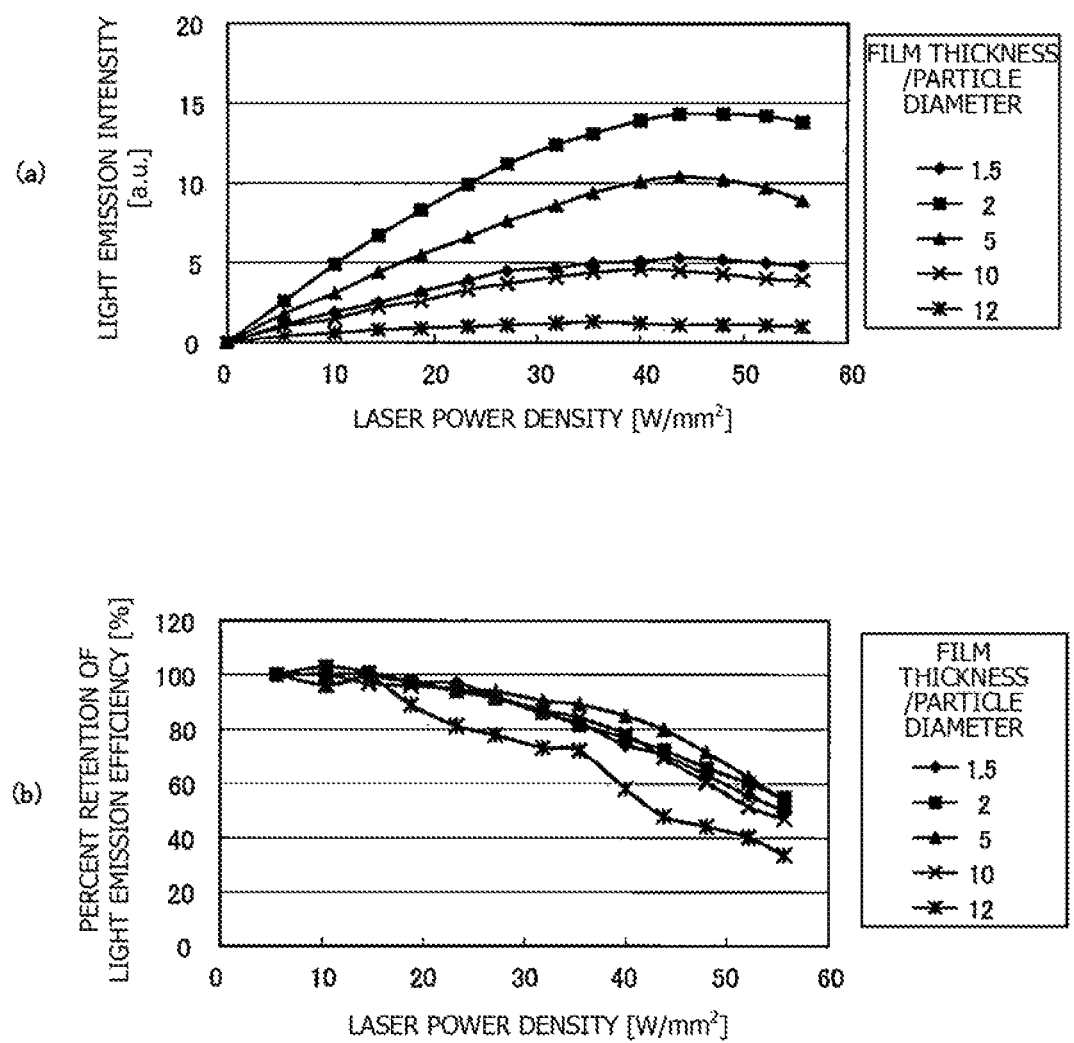
FIGS. 5(a) and 5(b) are graphs showing light-emission characteristics when the thickness of a fluorescent material layer was changed while the diameter of fluorescent material particles was held constant.

The evaluation results show the light-emission characteristics of each fluorescent material layer. FIGS. 5(a) and 5(b) are graphs showing the light-emission characteristics when the ratio of the thickness of the fluorescent material layer was changed while the diameter of the fluorescent material particles was held constant. The emission intensity of fluorescence and the percent retention of light emission efficiency at different laser power densities are shown for each condition.

As can be seen from FIGS. 5(a) and 5(b), when the ratio of the film thickness of the fluorescent material layer/the particle diameter of the fluorescent material particles is 2 to 12, the emission intensity of fluorescence tends to increase as the above ratio decreases. When the ratio of the film thickness of the fluorescent material layer/the particle diameter of the fluorescent material particles is appropriately small, the light transmittance of the fluorescent material layer is optimized. In this case, a large amount of light may be easily transmitted while the performance of the fluorescent material to convert the excitation light is maximized.

When the ratio of the film thickness of the fluorescent material layer/the average particle diameter of the fluorescent material particles is 1.5, the emission intensity of fluorescence is smaller than that when the ratio is 2. This may be because of the following reason. Since the ratio of the film thickness to the particle diameter is excessively small, a large portion of the excitation light passes through the fluorescent material layer without being converted. In this case, the light conversion performance of the fluorescent material is not sufficiently obtained, and the emission intensity of fluorescence decreases. When the film thickness is excessively larger than the particle diameter, the light transmittance of the fluorescent material layer decreases. In this case, the emission intensity of fluorescence emitted in the same direction as the propagation direction of the excitation light may decrease.

(3. Examination of Emission Intensity of Fluorescence and Percent Retention of Light Emission Efficiency at Different Ratios of Film Thickness/Average Particle Diameter)

(3-1) Method for Producing Samples

A paste prepared by mixing ethyl silicate, terpineol, and YAG-based fluorescent material particles was applied to (transmissive) sapphire plates used as substrates by a screen printing method.

(3-2) Evaluation Method

Each of the wavelength conversion members obtained by the above wavelength conversion member production method was irradiated with laser light using the transmissive-type evaluation system 700 to examine the emission intensity of fluorescence at a laser power density of 5 W/mm$^2$. For each of the samples in which the ratio of the film thickness/the average particle diameter was changed within an appropriate range including the range shown in Table 1 while the particle diameter was held constant, the intensity of light emitted was measured at a low-laser power density of 5 W/mm$^2$. The light emission intensity value of a sample having a film thickness that gives the largest light emission intensity was used as a reference value (a central value). For other samples (having the same particle diameter as the reference value sample but having different film thicknesses), when the value at their film thickness was equal to or more than 50% as compared with the reference value, a pass rating was given. When the value was less than 50% as compared with the reference value, a fail rating was given.

When converted light obtained by light-conversion using a fluorescent material is used, it is necessary to cause light serving as the excitation light to pass through as much as possible or to prevent the light from passing through as much as possible, in order to obtain an intended color. In both cases, it is judged that, if the emission intensity of the fluorescence obtained from the fluorescent material (referred to as "fluorescence intensity" in the table) is less than 50% of the maximum fluorescence intensity, the wavelength conversion member is useless for a lighting device. Therefore, the reference value is set to 50%.

(3-3) Evaluation Results

The following table summarizes the conditions and results.

TABLE 3

|  | Fluorescent<br>material | Average<br>particle<br>diameter [μm] | Film<br>thickness<br>[μm] | Film thickness/<br>particle<br>diameter [—] | Fluorescence<br>intensity [—] | Ratio to maximum<br>fluorescence<br>intensity [%] |
|---|---|---|---|---|---|---|
| Ex. | YAG | 0.6 | 4 | 6.7 | 0.8 | 100.0 |
| Ex. | YAG | 0.6 | 8 | 13.3 | 0.6 | 75.0 |
| Com. Ex. | YAG | 0.6 | 20 | 33.3 | 0.2 | 25.0 |
| Com. Ex. | YAG | 0.9 | 1.5 | 1.7 | 0.5 | 41.7 |
| Ex. | YAG | 0.9 | 2 | 2.2 | 1.2 | 100.0 |
| Ex. | YAG | 0.9 | 3 | 3.3 | 1.2 | 100.0 |
| Ex. | YAG | 0.9 | 10 | 11.1 | 1.0 | 83.3 |
| Ex. | YAG | 0.9 | 15 | 16.7 | 0.8 | 66.7 |
| Ex. | YAG | 0.9 | 20 | 22.2 | 0.7 | 58.3 |
| Com. Ex. | YAG | 0.9 | 30 | 33.3 | 0.5 | 41.7 |

TABLE 3-continued

|  | Fluorescent material | Average particle diameter [μm] | Film thickness [μm] | Film thickness/particle diameter [—] | Fluorescence intensity [—] | Ratio to maximum fluorescence intensity [%] |
|---|---|---|---|---|---|---|
| Com. Ex. | YAG | 3 | 6 | 1.7 | 0.8 | 47.1 |
| Ex. | YAG | 3 | 8 | 2.7 | 1.7 | 100.0 |
| Ex. | YAG | 3 | 12 | 4.0 | 1.8 | 94.1 |
| Ex. | YAG | 3 | 20 | 6.7 | 1.2 | 70.6 |
| Ex. | YAG | 3 | 40 | 13.3 | 1.0 | 58.8 |
| Com. Ex. | YAG | 3 | 60 | 20.0 | 0.7 | 41.2 |
| Com. Ex. | YAG | 6 | 9 | 1.5 | 1.1 | 42.3 |
| Ex. | YAG | 6 | 14 | 2.3 | 2.8 | 100.0 |
| Ex. | YAG | 6 | 20 | 3.3 | 2.2 | 84.6 |
| Ex. | YAG | 6 | 30 | 5.0 | 1.8 | 69.2 |
| Ex. | YAG | 6 | 40 | 6.7 | 1.5 | 57.7 |
| Com. Ex. | YAG | 6 | 60 | 10.0 | 1.0 | 38.5 |
| Com. Ex. | YAG | 6 | 70 | 11.7 | 0.4 | 15.4 |
| Com. Ex. | YAG | 6 | 80 | 13.3 | 0.2 | 7.7 |
| Com. Ex. | YAG | 9 | 15 | 1.7 | 0.6 | 26.1 |
| Ex. | YAG | 9 | 20 | 2.2 | 2.3 | 100.0 |
| Ex. | YAG | 9 | 40 | 4.4 | 2.1 | 91.3 |
| Ex. | YAG | 9 | 80 | 8.9 | 1.7 | 73.9 |
| Com. Ex. | YAG | 9 | 100 | 11.1 | 0.8 | 34.8 |
| Com. Ex. | YAG | 13 | 15 | 1.2 | 0.9 | 34.6 |
| Ex. | YAG | 13 | 20 | 1.5 | 2.0 | 76.9 |
| Ex. | YAG | 13 | 30 | 2.3 | 2.6 | 100.0 |
| Ex. | YAG | 13 | 40 | 3.1 | 2.6 | 100.0 |
| Ex. | YAG | 13 | 60 | 4.6 | 2.2 | 84.6 |
| Com. Ex. | YAG | 13 | 80 | 6.2 | 0.9 | 34.8 |
| Com. Ex. | YAG | 18 | 20 | 1.1 | 0.8 | 26.7 |
| Ex. | YAG | 18 | 30 | 1.7 | 2.2 | 73.8 |
| Ex. | YAG | 18 | 40 | 2.2 | 2.8 | 93.3 |
| Ex. | YAG | 18 | 60 | 3.3 | 3.0 | 100.0 |
| Ex. | YAG | 18 | 80 | 4.4 | 2.5 | 83.8 |
| Com. Ex. | YAG | 18 | 120 | 6.7 | 0.7 | 23.3 |
| Com. Ex. | YAG | 62 | 80 | 1.3 | 0.9 | 30.0 |
| Ex. | YAG | 62 | 100 | 1.6 | 3.0 | 100.0 |
| Ex. | YAG | 62 | 200 | 3.2 | 2.6 | 93.3 |
| Ex. | YAG | 62 | 300 | 4.8 | 2.3 | 76.7 |
| Com. Ex. | YAG | 62 | 400 | 6.5 | 0.8 | 26.7 |
| Com. Ex. | YAG | 85 | 100 | 1.2 | 0.6 | 20.7 |
| Ex. | YAG | 85 | 200 | 2.4 | 2.9 | 100.0 |
| Ex. | YAG | 85 | 400 | 4.7 | 2.3 | 79.3 |
| Com. Ex. | YAG | 85 | 450 | 5.3 | 0.8 | 27.6 |

As can be seen, for each of the transmissive-type wavelength conversion members, the average particle diameter of the fluorescent material particles and the ratio of the thickness of the fluorescent material layer/the average particle diameter of the fluorescent material particles satisfy the criteria within the ranges shown in Table 1.

(4. Differences due to Types of Fluorescent Material Particles)

(4-1) Method for Preparing Samples

A paste prepared by mixing ethyl silicate, terpineol, and YAG-based fluorescent material particles was applied to sapphire plates used as substrates to a thickness of 40 μm using a screen printing method. Fluorescent material particles having three different average particle diameters of 6, 13, and 18 μm were used.

(4-2) Evaluation Method

Each of the wavelength conversion members obtained by the above wavelength conversion member production method using the sapphire substrates was irradiated with laser light using the transmissive-type evaluation system 700, and the emission intensity of fluorescence and the percent retention of light emission efficiency were examined while the lower power density was changed.

(4-3) Evaluation Results

Figure 6:
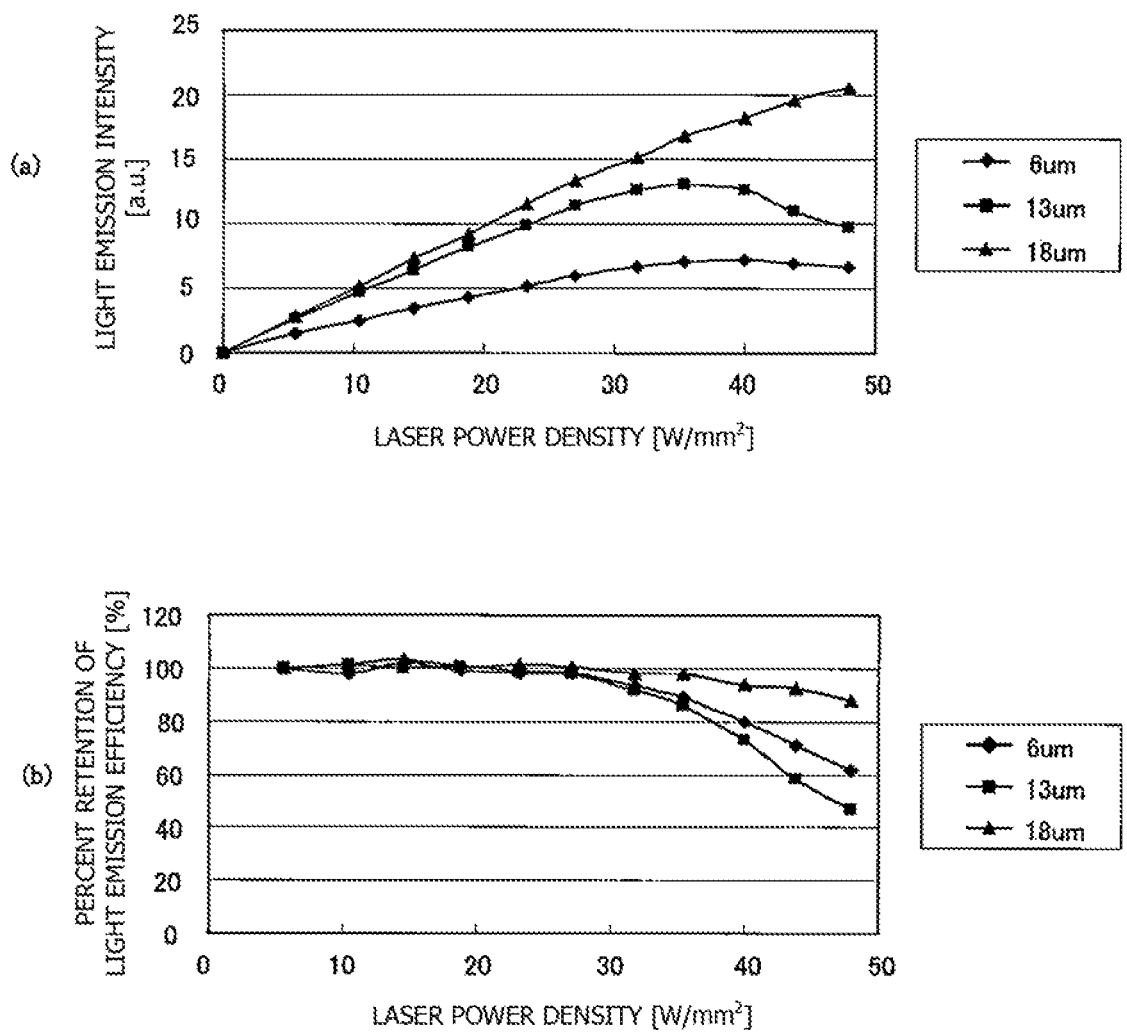
FIGS. 6(a) and 6(b) are graphs showing light-emission characteristics when the average particle diameter of the fluorescent material particles was changed.

FIGS. 6(*a*) and 6(*b*) are graphs showing the light-emission characteristics when the average particle diameter of the fluorescent material particles was changed. As can be seen from FIGS. 6(*a*) and 6(*b*), the larger the average particle diameter of the fluorescent material particles, the higher the emission intensity of the fluorescence. This may be because of the following two effects. The larger the fluorescent material particles, the higher the conversion efficiency. As the size of the fluorescent material particles increases, the number of contact points between the fluorescent material particles decreases, and heat accumulation can thereby be prevented.

(5. Porosity)

(5-1) Method for Producing Samples

A paste prepared by mixing ethyl silicate, terpineol, and YAG fluorescent material particles (average particle diameter: 18 μm) was applied to sapphire plates used as substrates to a thickness of 40 μm using a screen printing method to thereby obtain wavelength conversion member samples.

(5-2) Evaluation Method

For each of the wavelength conversion members obtained, its porosity was computed, and a laser irradiation test was performed to examine the relation between the porosity and the emission intensity of fluorescence and the relation between the porosity and the point of saturation. The porosity of a fluorescent material film is defined as the ratio of the volume of pore portions in the fluorescent material film to the apparent volume of a region surrounded by straight lines connecting surfaces of outermost ones of the fluorescent material particles in the fluorescent material film.

The porosity was computed using the above definition. The volume of the pore portions was computed by subtracting the volume of a solid component from the apparent volume.

(5-3) Evaluation Results

Figure 7:
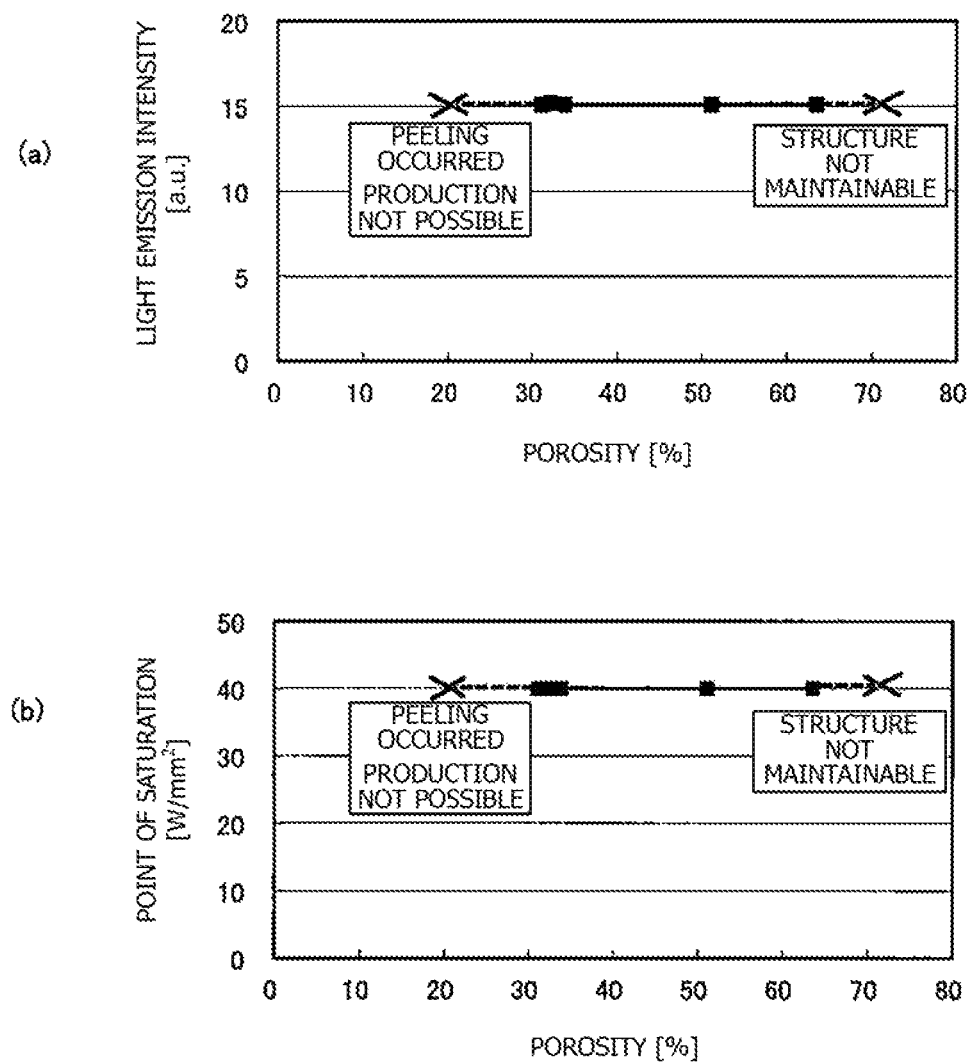
FIGS. 7(a) and 7(b) are graphs showing the relation between porosity and the emission intensity of fluorescence and the relation between the porosity and the point of saturation, respectively.

FIGS. 7(a) and 7(b) are graphs showing the relation between the porosity and the emission intensity of fluorescence and the relation between the porosity and the point of saturation, respectively. As can be seen from the relation between the porosity and the emission intensity of fluorescence and the relation between the porosity and the point of saturation shown in FIGS. 7(a) and 7(b), when the porosity is within the range of 30 to 70%, the emission intensity of fluorescence and the point of saturation are stable. If the porosity is less than 30%, it is difficult to produce a wavelength conversion member because peeling occurs during heat treatment for production. The peeling may be caused by the difference in thermal expansion between the substrate and the fluorescent material layer. If the porosity is 70% or more, it is difficult to produce a wavelength conversion member because the structure of the fluorescent material layer is difficult to maintain.

(6. Comparison with Sintered Body)

(6-1) Evaluation Method

A wavelength conversion member (film thickness: 40 μm) of the present invention obtained by the above wavelength conversion member production method and a fluorescent material plate formed of a sintered body (a square plate-shaped body with sides of 20.0 mm and a thickness of 1.0 mm) were irradiated with laser light using the transmissive-type evaluation system 700 to examine the emission intensity of fluorescence versus the laser power density, and a change in emission intensity of fluorescence caused by the difference in porosity was examined.

The porosity of a fluorescent material film is defined as the ratio of the volume of pore portions in the fluorescent material film to the apparent volume of a region surrounded by straight lines connecting surfaces of outermost ones of the fluorescent material particles in the fluorescent material film. The porosity was computed using the above definition. The volume of the pore portions was computed by subtracting the volume of a solid component from the apparent volume. The porosity of the wavelength conversion member was 40%, and the porosity of the sintered body was less than 1%.

(6-2) Evaluation Results

Figure 8:
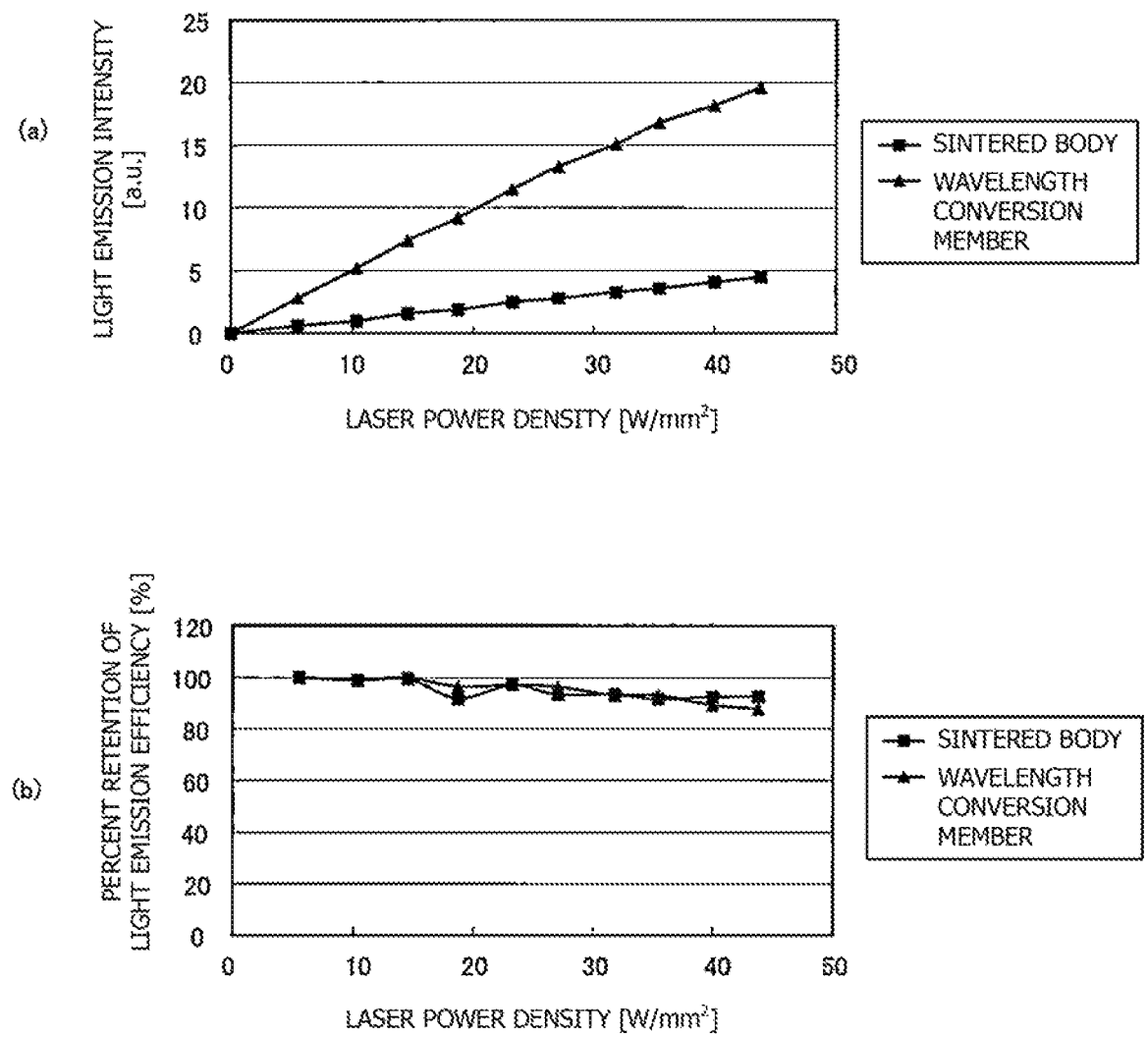
FIGS. 8(a) and 8(b) are graphs showing the light-emission characteristics of a sintered body and a wavelength conversion member.

FIGS. 8(a) and 8(b) are graphs showing the light-emission characteristics of the sintered body and the wavelength conversion member. As can be seen from FIGS. 8(a) and 8(b), the emission intensity of fluorescence is higher in the wavelength conversion member. This may be because of the following reason. Light is scattered by the pores in the layer of the wavelength conversion member and is thereby converted efficiently, so that the emission intensity of fluorescence is high. The sintered body having a smaller number of pores is dense. Therefore, less light scattering occurs inside the sintered body, and the laser light may pass through the sintered body.

The sintered body having a smaller porosity allows the laser light to pass through although its thickness is 1 mm (1,000 μm). However, although the thickness of the wavelength conversion member of the present invention is 40 μm, the wavelength conversion member is very effective. This is because of the following reason. The wavelength conversion member includes optimal pores, and the light can thereby be scattered, so that the fluorescence can be effectively extracted.

DESCRIPTION OF REFERENCE NUMERALS 10 light-emitting device
50 light source
100 wavelength conversion member
110 substrate
120 fluorescent material layer
121 light-transmitting ceramic
122 fluorescent material particles
410 paste
510 ink squeegee
520 silk screen
600 furnace
700, 800 evaluation system
710 light source
720 plano-convex lens
730 biconvex lens
735 band-pass filter
740 power meter

What is claimed is:

1. A transmissive-type wavelength conversion member that converts light with a wavelength in a specific range to light with a different wavelength and allows light passing through the wavelength conversion member to be used as illuminating light, the wavelength conversion member being characterized by comprising:
   a substrate that is formed of an inorganic material and allows light to pass therethrough; and
   a fluorescent material layer disposed on the substrate, the fluorescent material layer including fluorescent material particles that absorb light and emit converted light and a light-transmitting ceramic that bonds the fluorescent material particles together,
   wherein a ratio of a thickness of the fluorescent material layer to an average particle diameter of the fluorescent material particles is equal to or more than 1.5 and less than 30,
   wherein, when source light having a wavelength in a specific range and a power density of 5 $W/mm^2$ is used, an intensity of fluorescence from the fluorescent material layer is at least 50% of a maximum fluorescence intensity of the fluorescent material layer, and
   wherein the fluorescent material layer has a porosity of 30 to 70%, the porosity being defined as the ratio of the volume of pore portions in a constant-thickness layer section to the apparent volume of the constant-thickness layer section, the constant-thickness layer section being sandwiched between a plane in contact with the surface of an outermost one of the fluorescent material particles and a plane in contact with the substrate, the volume of the pore portions being computed by subtracting the volume of a solid component included in the apparent volume from the apparent volume.

2. A wavelength conversion member according to claim 1, wherein the wavelength conversion member satisfies the following conditions:
   (a) when the average particle diameter of the fluorescent material particles is less than 1 μm, the ratio of the thickness of the fluorescent material layer to the average particle diameter of the fluorescent material particles is at least 2 and less than 30;
   (b) when the average particle diameter of the fluorescent material particles is at least 1 and less than 5 μm, the ratio of the thickness of the fluorescent material layer to the average particle diameter of the fluorescent material particles is at least 2 and less than 15;

(c) when the average particle diameter of the fluorescent material particles is at least 5 and less than 10 µm, the ratio of the thickness of the fluorescent material layer to the average particle diameter of the fluorescent material particles is at least 2 and less than 10; and (d) when the average particle diameter of the fluorescent material particles is at least 10 µm, the ratio of the thickness of the fluorescent material layer to the average particle diameter of the fluorescent material particles is at least 1.5 and less than 5.

3. A wavelength conversion member according to claim 1, wherein the substrate is made of sapphire.

4. A light-emitting device comprising:
a light source that generates source light having a wavelength in a specific range; and
the wavelength conversion member according to claim 1, the wavelength conversion member emitting light while absorbing the source light and converting the source light to light having a different wavelength.

* * * * *